United States Patent [19] [11] 4,105,916
Siegel [45] Aug. 8, 1978

[54] METHODS AND APPARATUS FOR SIMULTANEOUSLY PRODUCING AND ELECTRONICALLY SEPARATING THE CHEMICAL IONIZATION MASS SPECTRUM AND THE ELECTRON IMPACT IONIZATION MASS SPECTRUM OF THE SAME SAMPLE MATERIAL

[75] Inventor: Melvin W. Siegel, Pittsburgh, Pa.

[73] Assignee: Extranuclear Laboratories, Inc., Pittsburgh, Pa.

[21] Appl. No.: 772,905

[22] Filed: Feb. 28, 1977

[51] Int. Cl.[2] .............................................. H01J 37/08
[52] U.S. Cl. .................................... 250/282; 250/292; 250/423 R
[58] Field of Search ........... 250/281, 282, 285, 423 R, 250/427, 292

[56] References Cited

U.S. PATENT DOCUMENTS

| | | | |
|---|---|---|---|
| 3,115,591 | 12/1963 | Brümee | 250/423 R |
| 3,405,263 | 10/1968 | Wamless et al. | 250/285 |
| 3,886,365 | 5/1975 | Kruger et al. | 250/423 R |
| 3,924,134 | 12/1975 | Uman et al. | 250/423 R |
| 3,984,692 | 10/1976 | Arsenault | 250/423 R |
| 3,992,632 | 11/1976 | Kruger et al. | 250/423 R |

*Primary Examiner*—Alfred E. Smith
*Assistant Examiner*—B. C. Anderson
*Attorney, Agent, or Firm*—Mason, Mason and Albright

[57] ABSTRACT

A method and apparatus for mass spectrometry employing tandem chemical ionization (CI) and electron impact (EI) ionization chambers with independent ionizing electron sources, both CI and EI ions being produced simultaneously. Through electronic shuttering either the CI or EI ions may be transmitted to the mass spectrometer while the ions of the other type are dispersed and rejected. The shuttering being accomplished very rapidly relative to the mass scan rate, which is in turn fast with respect to temporal variations in sample material composition. The two interwoven ion sequences are demultiplexed and smoothed into independent and effective simultaneous CI and EI mass spectrum channels.

44 Claims, 3 Drawing Figures

METHODS AND APPARATUS FOR SIMULTANEOUSLY PRODUCING AND ELECTRONICALLY SEPARATING THE CHEMICAL IONIZATION MASS SPECTRUM AND THE ELECTRON IMPACT IONIZATION MASS SPECTRUM OF THE SAME SAMPLE MATERIAL

BACKGROUND OF THE INVENTION

1. Field of the Invention

The invention relates to the field of chemical ionization (CI) and electron impact ionization (EI) mass spectrometry. In this field it is regarded as advantageous to use a single ion source which can be operated in either the CI or EI mode. By means of apparatus and methods disclosed herein a sample material in a single ion source is analyzed effectively simultaneously in CI and EI modes, the CI and EI mass spectra being separated by electronic means to provide simultaneous display of the two types of mass spectra.

2. Discussion of the Prior Art

In the prior art of chemical ionization (CI) mass spectrometry and electron impact ionization (EI) mass spectrometry it has been regarded as useful to construct ion sources which, by means of mechanical and electrical changes, operate in either the EI or CI mode. It is considered advantageous to change from one mode to the other in as short a time as possible, for with a rapid changeover it becomes possible to examine both the CI and EI spectra of transient sample materials as obtained by thermal evolution of a heated sample or as observed in the effluent of a gas chromatograph or liquid chromatograph. Such devices employ one ionization chamber which is operated in either the CI or EI modes, and one filament as the electron supply for either mode of operation.

Past commercial practice has been to use a mechanical linkage for changing the sizes of the required apertures for electron entry and ion exit, and to provide electrical means for the required changes in electron energy and ion optical parameters, such changes being accomplished without venting the vacuum system. Such past practice has developed to a state whereby the changeover is accomplished within several seconds. Problems arise in attempting to reduce the time further because of the relatively slow nature of even the fastest mechanical motions, and the fact that when only one ionization chamber is used for both CI and EI modes the ionization chamber must be filled with reagent gas when switching from EI to CI and emptied when switching from CI to EI. A subsidiary complication is that the reagent gas valve must be actuated in concert with the required electrical and mechanical changes.

SUMMARY OF THE INVENTION

An important innovative aspect of the invention is providing tandem ionization chambers in which CI and EI spectra are generated simultaneously for the same sample gas stream. Further, two separate electron sources are provided for CI and EI. When two thermionically emitting filaments are used, the first is held at a high negative voltage with respect to the CI chamber, the high voltage being advantageous for the electrons to penetrate a sufficient distance into the CI chamber, which is maintained at a pressure in the range 0.1 - 10 torr. The second filament is held at a moderate negative voltage with respect to the EI chamber, the moderate voltage being advantageous because electron impact ionization cross sections generally reach their maximum values for electrons in the energy range between about 50 and 100 eV. Also the EI chamber is maintained at a pressure of $10^{-5}$ to $5 \times 10^{-4}$ torr which is sufficiently low for the ions to have adequate mean free path therein, and is sufficiently high that the sample density in the chamber is adequate.

An additional innovation of the invention is a method for electronically segregating the ions made in the CI chamber from the ions made in the EI chamber, which comprises an intrinsically rapid electronic segregation process. Thus by rapidly alternating between rejection of ions from the CI chamber with acceptance of ions from the EI chamber and vice versa, the mass spectrometer and its detection system are presented with alternate sequences of CI ions and EI ions. Then by appropriate synchronous steering of the mass spectrometer signal into separate and appropriately filtered display channels, a two channel effectively simultaneous display of CI and EI mass spectra is obtained.

The apparatus has a vacuum chamber with a wall containing a centrally located differential pumping aperture which divides the chamber into two sub-chambers. The differential pumping aperture is approximately 3 mm in diameter, although it may be in the range 0.5 mm - 10 mm depending on the application. In this apparatus the differential pumping aperture preferably is electrically isolated from the wall in which it is mounted whereby it forms part of the ion-optical system for collecting and focusing ions from the ion source into the mass spectrometer.

The lower pressure sub-chamber is maintained during normal operation at a vacuum having an absolute pressure in the range of several times $10^{-6}$ torr by means of a baffled oil diffusion pump. However, the type of pump is not essential and any of several types of pumping apparatus well known in the art would be appropriate. This low pressure sub-chamber contains a quadrupole mass filter with its entrance directly facing the differential pumping aperture and its exit facing an electron multiplier for the purpose of amplifying the detected ion current. Any of several types of mass selection and ion detection apparatus may be substituted for this arrangement without departing from the spirit of the invention.

The higher pressure sub-chamber contains the tandem CI-EI ion source and is maintained at a pressure of $10^{-5}$ to $5 \times 10^{-4}$ torr during normal operation by a 500 liter-sec$^{-1}$ turbomolecular pump. At the upper end of this pressure range a turbomolecular pump is preferred over several other types of pump well known in the art, such as oil diffusion, but the use of a turbomolecular pump is not essential and several other types of pump may be utilized.

The ion source is contained within the higher pressure sub-chamber, and the flow rate of reagent and sample gases into the CI enclosure, thence into the EI space and finally into the lower pressure sub-chamber determines, in conjunction with the speed of the vacuum pump, the pressure in the higher pressure sub-chamber. This flow rate is adjusted as required by the application by means of appropriate fine metering valves well known in the art for the purpose of controlling the flow of reagent gas and sample gas. The sample material is not however restricted to introduction as a gas because the CI enclosure is provided with several entrance ports through which sample material may be introduced as a gas or as a liquid vaporized therein, or as vapor evolved from a solid sample contained in a heated probe of the type well known in the art.

The CI enclosure is a hollow cylinder approximately 1 cm in a diameter and 1 cm in height with its axis coincident with the axis of the differential pumping aperture between the sub-chambers and also coincident with the axis of the quadrupole mass filter. These dimensions are not critical, but the volume of the CI enclosure would normally be in the range 0.1 - 10 $cm^3$ as is usually employed in the prior art. The CI enclosure is provided with the above mentioned entrance apertures for various sample types and reagent gas, and is provided with a circular exit aperture on the cylinder axis, facing the quadrupole mass filter, and approximately 1.0 mm in diameter. The required size of this exit aperture is determined by ascertaining:

1. The operating pressure desired in the CI enclosure, normally 1 torr and possibly in the range 0.1 - 10 torr;
2. The operating pressure desired in the EI space, which will subsequently be shown to be approximately the same as the pressure in the enclosing higher pressure sub-chamber.
3. The pumping speed available in the higher pressure sub-chamber.

Conservation of matter requires that at equilibrium the mass flow out of the CI enclosure be equal to the mass flow through the higher pressure sub-chamber. If the speed of the pump is denoted $S_p$ liter-sec$^{-1}$ and the pressure in the higher pressure sub-chamber is denoted $P_1$ torr, the mass flow is then $$F = S_p P_1 \text{ torr-liter-sec}^{-1}$$

If the pumping speed of the exit aperture in the CI enclosure is denoted $S_A$ and the pressure therein is denoted $P_0$ it follows also that $$F = S_A P_0$$

We thus require an exit aperture of pumping speed $$S_A = S_p P_1 / P_0$$

It is well known that in the regime of free molecular flow the pumping speed of a circular aperture is given by $$S = \pi R^2 \frac{\overline{V}}{4}$$

when $r$ is the radius of the aperture and $\overline{V}$ is the mean molecular speed. A well known rule-of-thumb approximation to this result (most closely applicable to air) is $$S_A(\text{liter-sec}^{-1}) = 10\,\pi\, r^2$$

when $r$ is in cm, from which it follows that $$r \simeq \sqrt{\frac{S_p P_1}{10\,\pi\, P_O}}$$

For $S_p = 500$ liter-sec$^{-1}$, $P_1 = 10^{-4}$ torr, and $P_0 = 1$ torr, it follows that the diameter of the aperture needs to be approximately 1 mm, which is approximately the value provided.

In the cylindrical side wall of the CI enclosure at a location approximately 2 mm from the end containing the exit aperture, is also located a small slot approximately 0.2 mm in width and 2 mm in length, being oriented so that it lies in a plane perpendicular to the axis of the cylindrical enclosure. An exact calculation of the pressure requirements such as above must include the conductance of this slit in parallel with the conductance of the exit aperture, but for present purposes the above estimate is adequate. The purpose of this slit is to allow electrons from a filament outside the CI enclosure, in the sub-chamber at the lower pressure in the range $10^{-5}$ to $5 \times 10^{-4}$ torr previously described, to enter the CI enclosure. The present filament is a tungsten wire 0.001 inch in diameter and approximately 5 mm long centered on the slit and approximately 1 mm removed from it. The filament is ohmically heated to the point where it emits an electron current of 0.1 - 5mA when biased in typical operation at approximately 500 volts negative with respect to the CI enclosure. Other filament types, such as miniature dispensor cathodes, many in future applications prove valuable, and the details of the filament construction and operation are not essential to the concept of the invention. It is, however, important that a higher electron energy than is normally employed in EI applications be used in CI, in order that the electrons can penetrate sufficiently into the CI enclosure. This apparatus provides for electron energy as high as 5000 eV. In applicant's tests to date performance is observed to be optimum when the electron energy is about 500 eV, but in future applications higher energies may prove to be valuable.

CI ions leaving via the exit aperture enter a region consisting of a mesh cylinder approximately 25 mm in diameter and 25 mm in height, this cylinder serving two purposes:

1. It serves as an extractor for CI ions, being the first ion-optical lens in the CI focusing mode, and
2. With different electrical biasing, it serves as the EI space.

For the latter purpose, a second filament is located just outside the mesh. This filament is a coiled wire of thoria-coated iridium, but may be any of several other varieties, such details not being essential to the invention. This filament is operated in the normal manner of EI devices, that is it is biased between a few tens of volts up to somewhat over 100 volts negative with respect to the mesh cylinder, and its emission current to the mesh cylinder is regulated by a feed back circuit to be in the range 0.1 to 50 mA.

Both filaments may be operated simultaneously, so that CI ions are formed by the high energy electrons in the CI enclosure at approximately 1 torr, and EI ions are formed by the lower energy electrons in the EI space, which is at essentially the same pressure as the higher pressure sub-chamber in which it is located, i.e., approximately $10^{-4}$ torr. Between the mesh cylinder and the differential pumping aperture between the two vacuum sub-chambers are located several disks with central apertures, these serving as ion optical lenses for extracting and focusing the ions. The details of such extraction and focusing are well known in the art and need not be discussed here.

In order to observe CI ions, the CI enclosure is held at a positive voltage with respect to ground, this voltage, being typically in the range 2–15 volts, determining the energy of the CI ions as they pass through the mass filter. At the same time the mesh cylinder is held at some negative voltage, or even some small positive voltage below 2 volts, with respect to ground. Thus the EI ions are energetically forbidden to traverse the mass filter and even though EI ions are made continuously they are not observed. The majority of the EI ions in this mode of operation take paths from the mesh cylinder "backwards" toward the CI enclosure and are lost on its outer walls and on the shielding surrounding it and at its electrical potential.

In order to observe EI ions and exclude CI ions it is sufficient to raise the voltage on the mesh cylinder to a value a few volts in excess of the voltage on the CI enclosure. This provides sufficient ion energy for the EI ions that they can successfully traverse the mass filter, while at the same time providing a field between the CI enclosure and EI space which repels CI ions, the CI ions then being lost by reflecting back towards the outer walls of the CI enclosure and its shielding.

Thus to effect switching from observations of CI to EI ions and vice versa it is only necessary to change the potential on the mesh cylinder from a negative or only slightly positive value, which extracts CI ions and disperses EI ions, to a value positive with respect to the CI chamber, which causes the extraction of EI ions and the dispersal of CI ions. This may be accomplished simply and rapidly by electronic means well known in the art.

By additional means, also well known in the art, it is then possible, by means of appropriately steering the output signal of the mass spectrometer detector synchronously with the aforementioned switching between extraction of CI ions and extraction of EI ions, to demultiplex and smooth the two interwoven trains of ion signals into separate data channels, examples of which may include two channels of a dual-beam oscilloscope, or two pens of a multi-pen chart recorder, or two memory areas of a computer data acquisition system.

The mesh cylinder and lens elements, as well as the EI filament, were controlled by an Extranuclear Laboratories Ionizer Control Model 275-E2, so that for all practical purposes these parts might be operated as a separate electron impact ionizer. The 275-E2 unit was modified by the addition of a 20 KΩ resistor joining the junction of resistors R22, R40, R21, C4, and pin 5 of IC1 to a chasis feedthrough. Inasmuch as this point is the summing junction for ion energy control, by application of an externally supplied positive voltage to the chasis feedthrough, the ion energy, which is the mesh cylinder potential, is driven negative below its set value by an amount equal to the externally applied voltage.

This externally applied voltage was obtained from the "mass voltage" output of an Extranuclear Laboratories Model 091-6 Digital Mass Programmer equipped with Extranuclear Laboratories Model 091-8 Digital Mass Programmer Demultiplexer. Two channels of the 091-6/091-8 combination were used to correspond to EI and CI modes. In channel 0, corresponding to EI, a "mass" of 0 amu was set, yielding a corresponding output voltage of 0.00 volts, so that the potential of the mesh cylinder was equal to that potential set by its control dial. In channel 1, corresponding to CI, a "mass" of 999 amu was set, yielding a corresponding output voltage of 9.99 volts, so that the potential of the mesh cylinder was 9.99 volts lower than the potential set by its control dial. Since the potential set by the control dials was only about +6 volts, in the CI mode the potential of the mesh cylinder was driven to about −4 volts, so no EI ions could be transmitted by the mass filter. The potential of the CI enclosure was set at about +4 volts, so that in the EI mode no CI ions could be transmitted, as they were repelled by the +6 volts on the mesh cylinder.

Into each of channels 0 and 1 a dwell time per channel of 10 msec was set, whereupon the Demultiplexer Model 091-8 provided via its separate outputs for channels 0 and 1 signals corresponding respectively to EI and CI, and these signals were recorded on the two pens of a two channel chart recorder.

A preferable embodiment of this concept employs the electronic capability to change the lens voltages as well as the EI chamber potential, in view of the observation that optimum focusing voltages are different in the CI and EI modes. Otherwise, compromise focusing voltages may be used, resulting in some sacrifice in sensitivity of each mode. The CI enclosure may be replaced by any of a number of other ion source types, for example the Atmospheric Pressure Ion Source (API) in which the reagent gas is at atmospheric pressure and the primary ionizing agent is a radioactive source or a corona discharge. In such case, the preceeding discussion concerning simultaneous operation and electronic shuttering remains applicable, the essential exception being that the primary ionization source in the first of the tandem ionization chambers may be other than a thermionic electron emitting filament. Other possibilities for the first of two tandem ionization processes include but are not restricted to photo ionization, thermal ionization, surface ionization, and Penning ionization, where in each case subsequent EI ionization and electronic shuttering may be accomplished in the same manner as has been described in detail for the CI-EI combination.

Another method of separating the two classes of ions, for simplicity referred to as CI and EI but as previously indicated may incorporate any of several alternatives to CI, is to modulate any convenient parameter of the CI and EI process, for example, its electron energy or enclosure or space potential, with the intent not of causing total switching between observations of the two processes, but rather to tag one of the ion types with the modulation while leaving the other ion type untagged. Thus, if, as one of many possible examples, the EI ion energy is modulated, then the CI ions are unaffected and appear at the detector as a DC signal, but the EI ion signal, which is modulated, is received at the detector as an AC signal at the identical modulation frequency with a phase shift depending on the ion time-of-flight from EI space to ion detector. With the total ion signal displayed with appropriate filtering, it shows a spectrum consisting of the CI spectrum and the EI spectrum superimposed thereon, with the EI mass peak amplitudes being attenuated by a factor depending on the modulation depth. Further, with the total ion signal led into a lock-in amplifier of any of the many types well known in the art, the output of the lock-in amplifier corresponds only to the AC component of the total signal at the modulation frequency, that is, the lock-in amplifier responds only to the EI part of the total signal. In such a mode of operation the total signal may be led into both DC and lock-in amplifiers simultaneously, in which case the DC output represents a superposition of CI and EI signals, whereas the lock-in output corresponds to the EI signal only, these two outputs preferably being displayed in two separate data channels as discussed previously. The reference signal for the lock-in amplifier may be derived from the same external source which modulated (in this example) the EI electron energy, or alternatively, the lock-in amplifier's internal oscillator may be employed as the origin of the modulating voltage imposed on the EI electron energy. Although for the purposes of a clear explanation, a specific example of how the lock-in amplifier may be used for filtering the EI signal has been explained, there are many equivalents of the technique which also fall within the scope of the invention.

Other objects, adaptabilities and capabilities of the invention will be appreciated as the description progresses, reference being made to the accompanying drawings, in which:

DESCRIPTION OF THE PREFERRED EMBODIMENTS

Figure 1:
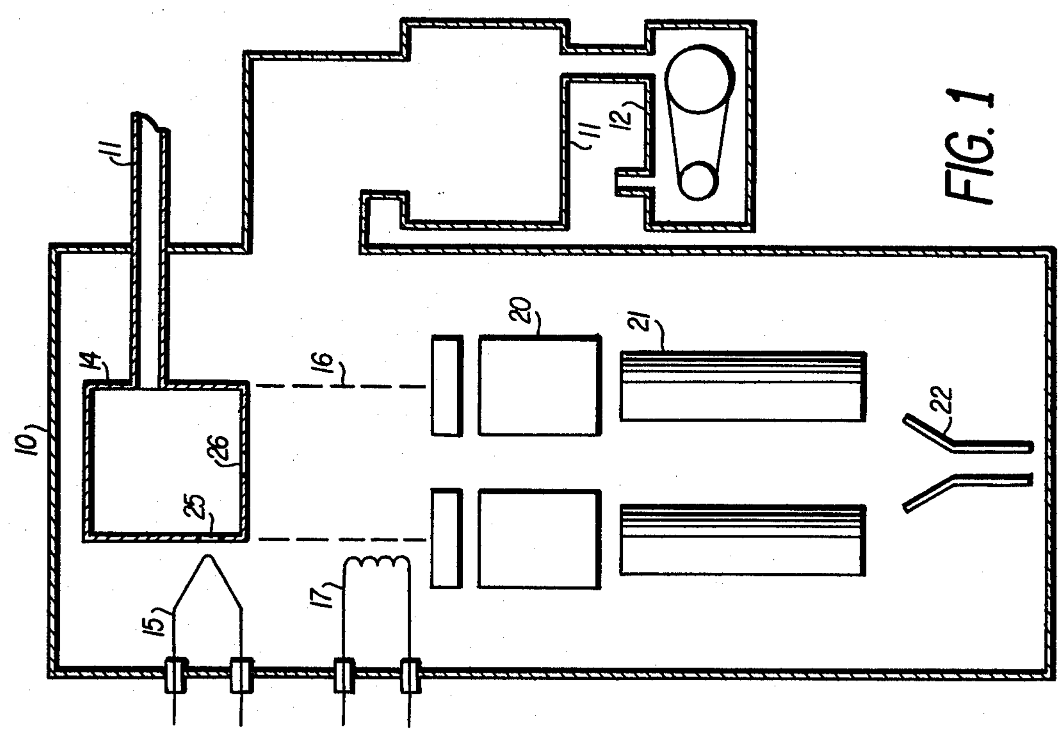
FIG. 1 is a diagrammic representation of a simplified version of the invention for explanatory purposes with certain details omitted for clarity. Tandem CI and EI ionization chambers are illustrated with separate electron emitting filaments in appropriate locations. Also illustrated is the location of the ion focusing arrangement, a mass spectrometer, shown as a quadrupole mass filter type.

Referring to the figures, in FIG. 1 a simplified representation of the invention is illustrated with certain details omitted for clarity. A vacuum chamber 10 is evacuated by a high vacuum pump 11 of the turbomolecular, oil diffusion, or other high capacity design. High vacuum pump 11 is backed by a mechanical forepump 12. Additional desirable vacuum features such as baffles, traps, and valves, well known in the art, are omitted from the figure. Within vacuum chamber 10 is a chemical ionization (CI) enclosure 14 and its associated electron emitting filament 15, an electron impact ionization (EI) mesh enclosed space 16 and its associated electron emitting filament 17, and ion optics package 20, the details of which are not shown, a quadrupole mass filter 21 which might alternatively be another type of mass spectrometer such as magnetic sector or any of a number of other types well known in the art, and an ion detection device 22, here shown as a continuous dynode electron multiplier which might alternatively be another type of detection device such as a Faraday cup, a discrete dynode particle multiplier, or any of a number of other types well known in the art. CI enclosure 14 is provided with a gas inlet 24, which generically depicts one of several inlet ports which are provided to the CI enclosure for reagent gas, reagent gas mixed with sample material, sample gas, or sample in the form of the vapor obtained by evaporation of a liquid solid sample. Electrons from filament 15 enter the CI enclosure through an aperture 25 which is a narrow slit. CI ions, reagent ions, and excess reagent gas and sample gas and vapor exit the CI chamber via aperture 26 which is a circular hole approximately 1 mm in diameter. Materials exiting aperture 26 pass into EI space 16, shown as a mesh cylinder, where the gases are further ionized by electron impact via electrons emitted by EI filament 17. Excess gases are removed through the mesh walls of EI space 16, while EI ions or CI ions, or both, depending on the choice of electrical biasing, are collected and focused by ion optics package 20 into mass analysis device 21 and then into ion detection device 22.

Figure 2:
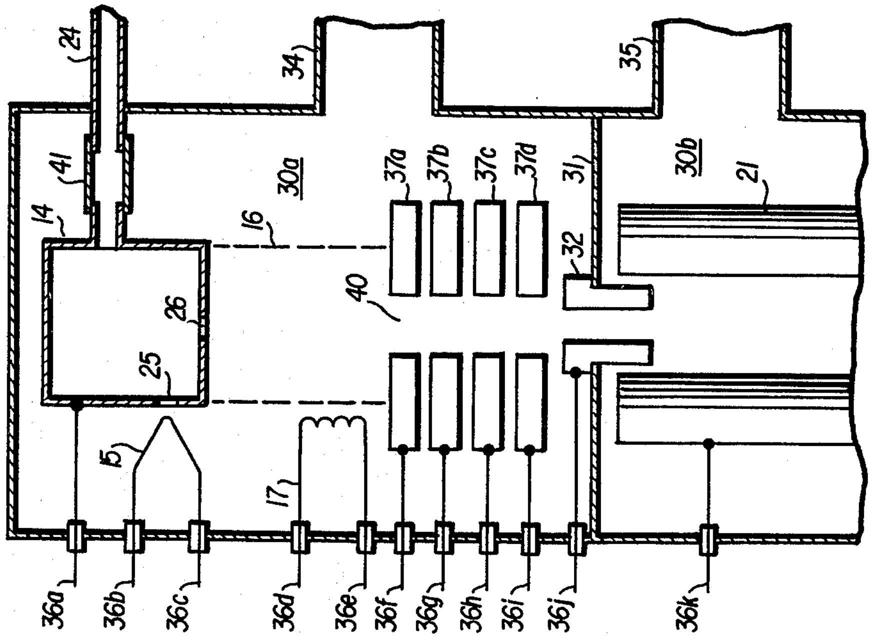
FIG. 2 is a more detailed diagrammatic representation of the apparatus. Certain features of the vacuum system, such as appropriate feedthroughs for gas and electrical connections, and a differential pumping aperture in a dividing wall, are included. More specific features of the ion focusing optics are also shown.

FIG. 2 is a representation of the invention with certain specific details explicitly indicated, although certain structure has nevertheless been omitted for clarity. The vacuum system is now shown divided into sub-chambers **30*a* and 30*b* by means of a separating wall 31 incorporating a differential pumping aperture 32 which is in this case electrically isolated from wall 31, so that differential pumping aperture 32 forms part of the ion optical focusing system. The two sub-chambers are separately evacuated via pumping ports 34 and 35 provided with separate vacuum pumping apparatus. Electrical feedthroughs are provided as 36*a* for establishing the CI enclosure 14 potential, 36*b* and 36*c* for heating and biasing the CI filament 15, 36*d* and 36*e* for heating and biasing EI filament 17, 36*f* for establishing the EI space 16 potential, 36*g*, 36*h*, 36*i*, and 36*j* for establishing the required ion focusing potentials on the ion lens elements 37*b*, 37*c*, 37*d*, and 32. Explicitly diagrammed is plate 37*a*, which is electrically part of EI chamber 16 and serves as a solid base for the aforementioned mesh cylinder, being provided with exit aperture 40 for the extraction of ions. Feedthrough 36*k* is one of two required high voltage rf feedthroughs by means of which the quadrupole mass filter is powered. The assembly 16, 17, 37*a*, 37*b*, 37*c*, 37*d*, 32 is similar or identical to a standard assembly known as Extranuclear Laboratories Incorporated Model 275-N2 API Focusing Lens Assembly. The electrically insulating section 41 in the reagent gas, or reagent gas mixed with sample gas, or other sample inlet line 24 is required to maintain the electrical isolation of CI enclosure 14, and for clarity only one inlet line 24 is shown although in practice several such lines are provided. Also, not shown are valving and pressure measuring gauges associated with the inlet lines 24 and vacuum sub-chambers 30*a* and 30*b***, these features being well known in the art.

Figure 3:
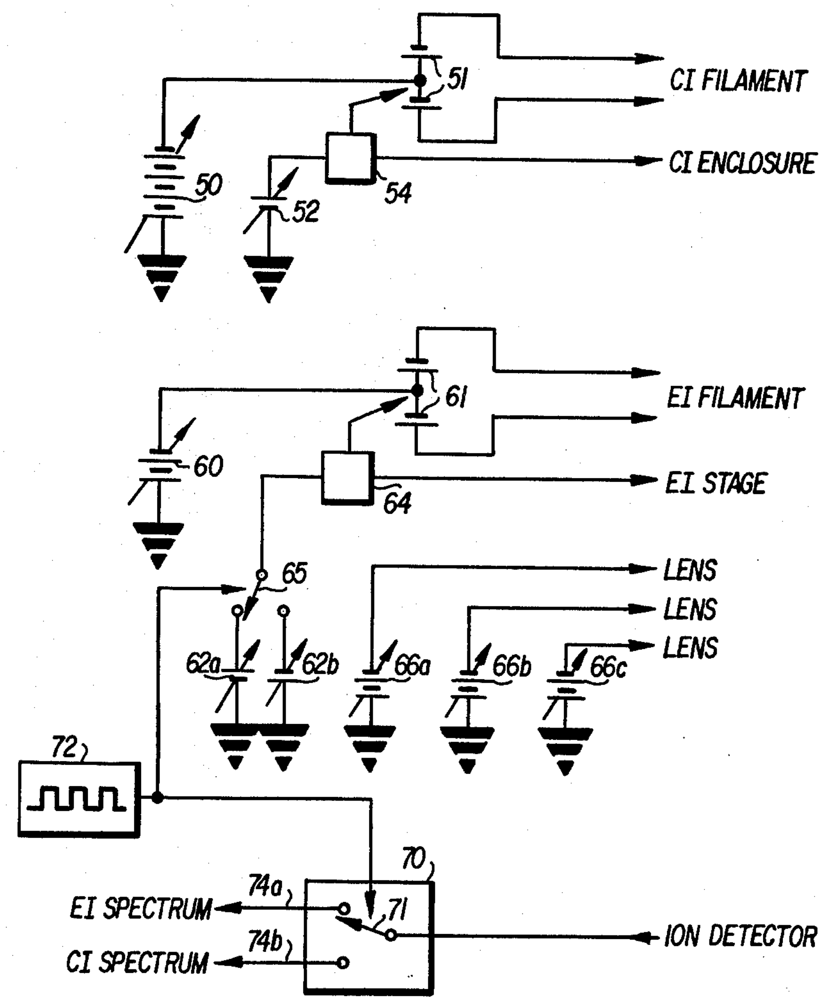
FIG. 3 is a schematic representation of an electronic control system for operating the ion source for simultaneous detection of CI and EI ions.

A schematic representation of the electronic apparatus required to operate this invention is shown in FIG. 3. A voltage supply 50 supplies negative voltage required to bias the CI filament, which is heated by floating power supply 51. A further voltage supply 52 supplies the positive voltage required to bias the CI enclosure for extraction of positive ions. An emission regulation circuit 54 monitors the CI electron current and provides feedback control to power supply 51 to maintain the required emission. Similarly a negative voltage supply 60, floating power supply 61, and emission regulation circuit 64 operate the EI filament. The EI space bias is symbolically shown as switched between positive and negative voltage supplies **62*a* and 62*b* by electronic or electromechanical means 65. Voltage supplier 62*a* and 62*b* may comprise a single bipolar voltage supply with externally switched programming. Lens voltage supplies 66*a*, 66*b*, 66*c* provide the required ion optical lens voltages. The detected ion signal, after the required amplification (the details for which are omitted) is routed to demultiplexing circuit 70 symbolically represented as an electronic or electromechanical switch 71. Symbolic switches 65 and 71 are operated synchronously by control unit 72 which provides at its output either of two voltage levels controlling the states of switches 65 and 71. By such means the ion detector is alternately presented with CI and EI mass spectral information which is synchronously demultiplexed into separate data channels 74*a* and 74*b*. In a more generalized representation of these concepts any combination or even all of the voltage and power supplies 50, 51, 52, 60, 61, *66a*, *66b* and *66c* may be switched between two possible states synchronously with the switching between *62a* and *62b***, such arrangement providing for more optimum setting of the ion optical parameters for each of the CI and EI modes of operation.

Although I have described the preferred embodiments of my invention, it is to be understood that it is capable of other adaptations and modifications within the scope of the appended claims. For example, it will be appreciated that sample gaseous fluid flows from enclosure 14 into the confined space 16 whereupon the electron radiation from elements 15 and 17 act on the same gas sample and, if desired, the radiation in either chamber may be modulated for identification purposes. Thus, further spaces and enclosures and radiation elements may be included within the sequence whereby ions produced therein may also be identified and their signals subsequently segregated from others. Accordingly, the expression of acts and structure in the claims is intended to cover not only corresponding acts and structure described in the specification, but also equivalents thereof.

Having thus described my invention, what I claim as new and desire to secure by Letters Patent of the United States, is:

1. A method for simultaneously producing and electronically separating a chemical ionization mass spectrum and an electron impact ionization mass spectrum of the same sample material, the method comprising the steps of:

placing a chemical ionization enclosure and an electron ionization space in tandem proximate the entrance of a mass spectrometer with said space interposed between the outlet of said enclosure and said entrance;

introducing the same sample material in said enclosure and said space;

ionizing said sample material in said enclosure and said space;

alternately electronically suppressing ions from discharging from said enclosure and from said space for receipt by said mass spectrometer by changing the potential surrounding said space alternately above and below the potential of said enclosure;

filtering and detecting the charge of said ions alternately received from said enclosure and said space by said mass spectrometer, and separating signals detected from said enclosure from those alternately received from said space and registering said signals separately.

2. A method in accordance with claim 1, wherein said sample material in said enclosure is ionized by higher energy radiation than the radiation which ionizes said sample material in said space.

3. A method in accordance with claim 1, wherein said enclosure is maintained at a positive voltage in range of 2 - 15 volts and said voltage level surrounding said space is alternated between voltages above and below said positive voltage.

4. A method in accordance with claim 1, wherein said separating of said signals comprises demultiplexing said signals into separate data channels.

5. A method for simultaneously producing and electronically separating two ionization types of mass spectra produced from the same sample material, the method comprising the steps of:

placing a first ionization means and a second ionization means in tandem proximate the entrance of a mass spectrometer with said second ionization means interposed between said first said ionization means and said mass spectrometer;

introducing the same sample material in both ionization means;

subjecting said sample material in each said ionization means to a different type of radiation to ionize at least a portion of each said sample material by the different means;

modulating the voltage level of said second ionization means relative to that of said first ionization means whereby the ionized material in at least one of said ionization means is alternately suppressed from discharge therefrom;

detecting the charge to mass ratio on selected particles of ionized material discharged from each said ionization means by alternately receiving and analyzing same by said mass spectrometer, and separating and registering signals produced by each said ionization means.

6. A method in accordance with claim 5, wherein only the voltage level of said second ionization means is modulated.

7. A method in accordance with claim 6, wherein said first ionization means is maintained at a voltage level of 2 - 15 volts and the voltage level of said second ionization means is alternately placed at voltage levels above and below said positive voltage.

8. A method in accordance with claim 7, wherein said first ionization means comprises an enclosure where the ions are produced by chemical ionization and said second ionization means comprises space where ions are produced by radiation impact.

9. A method in accordance with claim 8, wherein said radiation impact comprises electron impact on said sample material.

10. A method in accordance with claim 9, wherein said enclosure is maintained at an absolute pressure which is substantially higher than that in said space.

11. A method in accordance with claim 10, wherein said enclosure is maintained at a pressure of 0.1 to 10 torr and said space is maintained at a pressure of not greater than $5 \times 10^{-4}$ torr.

12. A method in accordance with claim 11, wherein said sample material in said enclosure is bombarded with electrons of sufficiently high energy to penetrate into said enclosure in spite of the relatively high pressure therein.

13. A method in accordance with claim 12, wherein said sample material in said space is impacted with electrons of sufficiently low energy that their electron impact ionization cross-sections are near maximum values.

14. A method in accordance with claim 7, wherein by the relative modulation of said ionization means, said signal produced by said one ionization means is detected as a direct current signal and said signal produced by said other ionization means is detected as an alternating current signal.

15. A method in accordance with claim 7, wherein only one of said ionization means is modulated.

16. A method in accordance with claim 15, wherein by simultaneously employing direct current signal amplification and lock-in amplification on the total ion signal received from both said ionization means, said total signal is separated into two parts wherein the direct current signal component represents the superposition of signals originating from both said ionization means and the lock-in component of said signal represents only the signal from said ionization means subject to modulation.

17. A method in accordance with claim 7, wherein said modulation is produced by electronic means in a repetitive alternating sequence.

18. A method in accordance with claim 17, wherein said electronic means provides electronic steering and filtering which is synchronous with said repetitive alternating sequence whereby the mass spectra produced from said first ionization means and from said second ionization means are demultiplexed into separate data channels.

19. A method in accordance with claim 18, wherein said separate data channels comprise two traces of a dual beam oscilloscope.

20. A method in accordance with claim 18, wherein said separate data channels comprise a chart recorder having at least two channels.

21. A method in accordance with claim 18, wherein said separate data channels comprise two memory areas of a computer data acquisition system.

22. A method in accordance with claim 7, wherein said mass spectrometer scans ions received therein for different mass-to-charge ratios, said scanning rate being rapid relative to the rate of variation of composition of said sample material, and said modulation being at a rate which is rapid relative to said scan rate.

23. In combination with a mass spectrometer, an ion source, said ion source comprising two ionization chambers which are positioned in tandem, means for producing ions in each said chamber associated therewith, and means for electronically and selectively suppressing the discharge of ions from at least one of said chambers for receipt into said mass spectrometer for analysis by changing the relative potential of said chambers.

24. Apparatus in accordance with claim 23, wherein one of said chambers comprises a chemical ionization enclosure and the other of said chambers comprises an electron ionization space.

25. Apparatus in accordance with claim 24, wherein said space is interposed between said enclosure and said mass spectrometers.

26. An apparatus in accordance with claim 25, wherein said enclosure and said space are each provided with separate electron emitting filaments.

27. Apparatus in accordance with claim 23, wherein said means for electrically and selectively suppressing the discharge of ions from at least one of said chambers comprises electronic shuttering means which performs the function of alternately accepting ions originating from each of said chambers while rejecting the ions originating from the other of said chambers.

28. Apparatus in accordance with claim 27, wherein said shuttering means comprises means for modulating the electrical potential differential between said chambers.

29. Apparatus in accordance with claim 28, wherein said shuttering means also changes the electrical potential on the ion optical elements and the mass filter axial potential of said mass spectrometer.

30. Apparatus in accordance with claim 28, wherein said shuttering means comprises electronic means which changes the relative electrical potentials between said chambers.

31. Apparatus in accordance with claim 23, wherein said means for electrically and selectively suppressing a discharge of ions comprises electronic means for changing the relative electrical potential between said chambers in repetitive alternating sequence.

32. Apparatus in accordance with claim 31, wherein said electronic means includes electronic steering and filtering means synchronous with said repetitive alternating sequence which performs the function of separating the ion mass spectra of said mass spectrometer by demultiplexing same into separate data channels.

33. Apparatus in accordance with claim 23, wherein the total ion signals produced by said mass spectrometer represents the superposition of ion mass spectra originating from both said chambers, there being provided means for simultaneously producing direct current amplification and lock-in amplification of said total ion signal.

34. Apparatus in accordance with claim 23, wherein the signal produced by said mass spectrometer is divided into separate data channels which are correlated by said means for electronically and selectively suppressing the discharge of ions whereby one of said data channels receives signals from only one of said chambers and the other said data channel receives signals from the other said chambers.

35. Apparatus in accordance with claim 34, wherein said separate data channels comprise two traces of a dual beam oscilloscope.

36. Apparatus in accordance with claim 34, wherein said separate data channels comprise a chart record having at least two channels.

37. Apparatus in accordance with claim 34, wherein said separate data channels comprise two memory areas of the computer data acquisition system.

38. Apparatus in accordance with claim 23, wherein said ionization chambers are provided with separate and different ionization means.

39. Apparatus in accordance with claim 38, wherein said means for electrically and selectively suppressing the discharge of ions from at least one of said chambers comprises an external logic signal means which varies the relative potentials between said chambers whereby ions first from one chamber and then from the other chamber are received by said mass spectrometer.

40. Apparatus in accordance with claim 39, wherein said logic signal means includes means for producing in repetitive sequence of duty factor 0.50 whereby equal repetitive samples of ions are received by said mass spectrometer from each of said chambers.

41. Apparatus in accordance with claim 39, wherein a demultiplexing arrangement is provided which is synchronized with said logic signal means for producing separate data channels from said chambers.

42. Apparatus in accordance with claim 23, wherein said means for electrically and selectively suppressing the discharge ions from at least one of said chambers comprises means for producing a square wave voltage on one of said chambers.

43. Apparatus in accordance with claim 42, which includes a lock-in amplifier for separating out of superimposed modulated and unmodulated ion types of the signal from said mass spectrometer, the signal component co-responding to the modulated ion type.

44. Apparatus in accordance with claim 43, which includes means of simultaneously displaying in separate direct and alternating current data channels the superimposed modulated and unmodulated ion types in a direct current channel mode and the modulated ion type only in an alternating current channel mode.

* * * * *